(12) United States Patent
Jung et al.

(10) Patent No.: US 10,825,699 B2
(45) Date of Patent: Nov. 3, 2020

(54) STANDBY PORT AND SUBSTRATE PROCESSING APPARATUS HAVING THE SAME

(71) Applicant: SEMES CO., LTD., Chungcheongnam-do (KR)

(72) Inventors: Buyoung Jung, Cheonan-si (KR); Jonghan Kim, Asan-si (KR); Young Jin Jang, Daegu (KR); Jin Tack Yu, Chungcheongnam-do (KR); Youngjun Choi, Asan-si (KR); Daehun Kim, Pyeongtaek-si (KR); Byungsun Bang, Gyeonggi-do (KR); Jonghyeon Woo, Asan-si (KR); Heehwan Kim, Sejong-si (KR); Cheol-Yong Shin, Seoul (KR); Gui Su Park, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 72 days.

(21) Appl. No.: 16/224,891

(22) Filed: Dec. 19, 2018

(65) Prior Publication Data
US 2019/0189471 A1    Jun. 20, 2019

(30) Foreign Application Priority Data

Dec. 20, 2017 (KR) .................. 10-2017-0175964

(51) Int. Cl.
*H01L 21/67* (2006.01)
*H01L 21/683* (2006.01)

(52) U.S. Cl.
CPC .. *H01L 21/67051* (2013.01); *H01L 21/67017* (2013.01); *H01L 21/67023* (2013.01); *H01L 21/6835* (2013.01)

(58) Field of Classification Search
CPC ......... H01L 21/67051; H01L 21/67017; H01L 21/67023; H01L 21/6835
See application file for complete search history.

(56) References Cited

U.S. PATENT DOCUMENTS 6,589,338 B1 *   7/2003   Nakamori ......... H01L 21/67051
                                                                   118/50

FOREIGN PATENT DOCUMENTS

| KR | 10-2011-0116471 A | 10/2011 |
| KR | 10-2012-0023296 A | 3/2012 |
| KR | 10-2016-0033358 A | 3/2016 |
| KR | 10-2016-0054145 A | 5/2016 |
| KR | 10-2017-0027511 A | 3/2017 |
| KR | 10-2017-0061749 A | 6/2017 |

OTHER PUBLICATIONS

Machine translation: KR 2016-0033358; Kim et al. (Year: 2016).*

* cited by examiner

*Primary Examiner* — Mikhail Kornakov
*Assistant Examiner* — Natasha N Campbell
(74) *Attorney, Agent, or Firm* — Li & Cai Intellectual Property (USA) Office

(57) ABSTRACT

Disclosed are a standby port and a substrate processing apparatus having the same. The standby port exhausts fumes generated when a processing liquid is discharged into the standby port before the supply of the processing liquid onto a substrate, thereby preventing pollution of a chamber atmosphere.

8 Claims, 10 Drawing Sheets

STANDBY PORT AND SUBSTRATE PROCESSING APPARATUS HAVING THE SAME

CROSS-REFERENCE TO RELATED APPLICATIONS

A claim for priority under 35 U.S.C. § 119 is made to Korean Patent Application No. 10-2017-0175964 filed on Dec. 20, 2017, in the Korean Intellectual Property Office, the entire contents of which are hereby incorporated by reference.

BACKGROUND

Embodiments of the inventive concept described herein relate to a standby port where a nozzle stands by and a substrate processing apparatus having the standby port, and more particularly, relate to a standby port for effectively removing fumes generated when a processing liquid is discharged from a nozzle, and a substrate processing apparatus having the standby port.

In general, a substrate processing process includes a liquid processing process of supplying a processing liquid onto a substrate.

FIG. 1 is a view illustrating an example of a general liquid processing apparatus. A processing liquid is supplied onto a substrate W through a nozzle 1. When the substrate W is not processed, the nozzle 1 stands by in a standby port 3.

While the nozzle 1 stands by in the standby port 3, the processing liquid is discharged from the nozzle 1 before a process or every predetermined time interval to maintain the temperature of the processing liquid or prevent pollution in the nozzle 1.

When the processing liquid is discharged, fumes are generated from the processing liquid. The fumes, as illustrated in FIGS. 2 and 3, are diffused into a chamber to contaminate the substrate W.

SUMMARY

Embodiments of the inventive concept provide a standby port for efficiently removing fumes generated when a processing liquid remaining in a nozzle is discharged into the standby port, and a substrate processing apparatus having the standby port.

Embodiments of the inventive concept provide a standby port for uniformly removing fumes in the entire region inside the standby port, and a substrate processing apparatus having the standby port.

Aspects of the inventive concept are not limited thereto, and any other aspects not mentioned herein will be clearly understood from the following description by those skilled in the art to which the inventive concept pertains.

According to an aspect of an embodiment, an apparatus for processing a substrate includes a support unit that supports the substrate, a container that surrounds the support unit and collects a processing liquid, a processing liquid supply unit including a nozzle that supplies the processing liquid onto the substrate supported by the support unit, and a standby port where the nozzle stands by when the substrate is not processed, the standby port being disposed on a side of the container. The standby port includes a body including an inner space that is open at the top such that the processing liquid discharged from the nozzle is introduced into the inner space, a drain line connected to the body to drain the processing liquid in the inner space, and an exhaust unit that exhausts an atmosphere in the inner space. The exhaust unit includes a housing having a ring shape, the housing surrounding the body and having an exhaust space into which the atmosphere in the inner space flows, and an exhaust line connected to the housing to forcibly exhaust an atmosphere in the housing.

An inlet of the exhaust space, into which the atmosphere in the inner space flows, may be provided above the inner space.

The exhaust line may be connected to a lower end region of the housing.

The housing may include a sidewall that surrounds the body and an upper wall extending inward from an upper end of the sidewall and located above the body. A spacing space between an upper end of the body and a lower end of the upper wall may serve as an inlet through which the atmosphere in the inner space flows into the exhaust space.

An area of a central hole formed in the center of the upper wall may be smaller than an area of the inner space when viewed from above.

The nozzle may be disposed above the upper wall when the processing liquid is discharged from the nozzle into the inner space, and a distance between an outlet end of the nozzle and the upper wall may be less than three times a vertical width of the inlet.

According to another aspect of an embodiment, a standby port includes a body including an inner space that is open at the top such that a processing liquid discharged from a nozzle is introduced into the inner space, a drain line connected to the body to drain the processing liquid in the inner space, and an exhaust unit that exhausts an atmosphere in the inner space. The exhaust unit includes a housing having a ring shape, the housing surrounding the body and having an exhaust space into which the atmosphere in the inner space flows, and an exhaust line connected to the housing to forcibly exhaust an atmosphere in the housing.

An inlet of the exhaust space, into which the atmosphere in the inner space flows, may be provided above the inner space.

The exhaust line may be connected to a lower end region of the housing.

The housing may include a sidewall that surrounds the body and an upper wall extending inward from an upper end of the sidewall and located above the body. A spacing space between an upper end of the body and a lower end of the upper wall may serve as an inlet through which the atmosphere in the inner space flows into the exhaust space.

According to embodiments of the inventive concept, since fumes generated in the standby port when a processing liquid is discharged from the nozzle are exhausted by the exhaust unit of the standby port, the fumes may be prevented from being diffused into the chamber.

Furthermore, since the exhaust unit has the ring-shaped housing that surrounds the body that provides a space where a processing liquid is discharged, and an atmosphere in the housing is forcibly exhausted through the exhaust line connected to the housing, exhaust efficiency may be improved, as compared with when an exhaust line is directly connected to the space where the processing liquid is discharged.

Effects of the inventive concept are not limited to the above-described effects, and any other effects not mentioned herein may be clearly understood from this specification and the accompanying drawings by those skilled in the art to which the inventive concept pertains.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
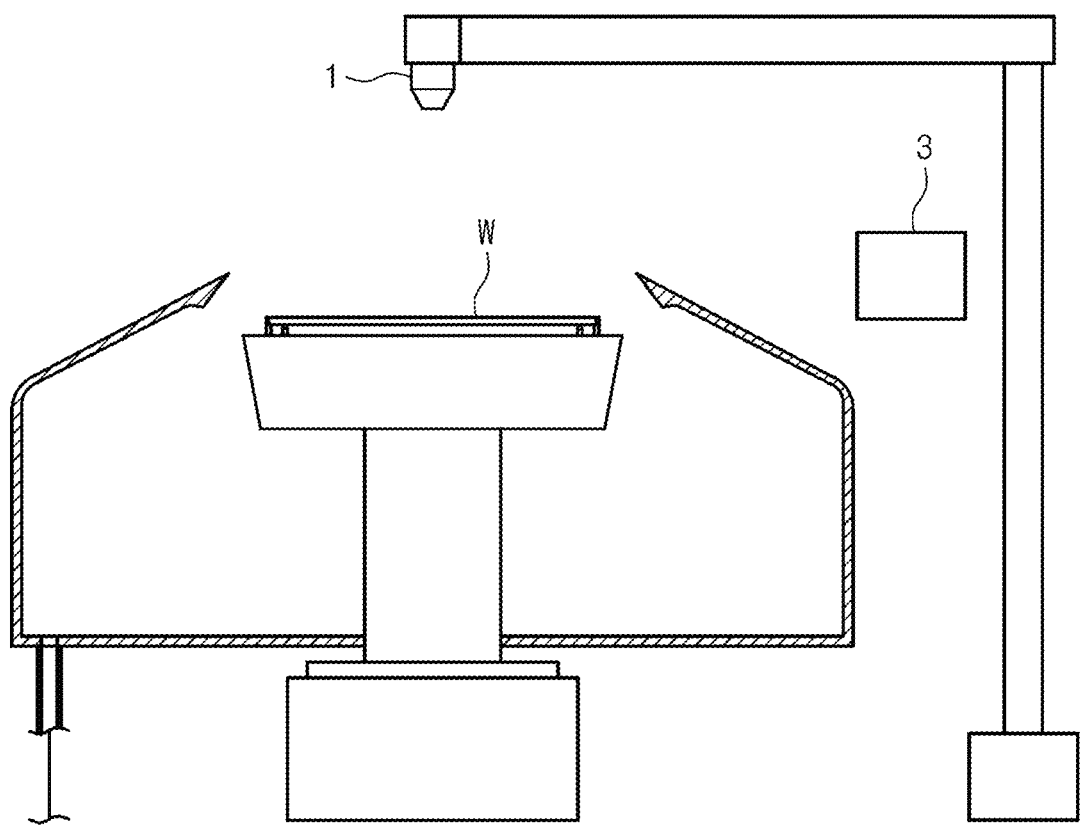
FIG. 1 is a schematic sectional view illustrating a general liquid processing apparatus.
Figure 2:
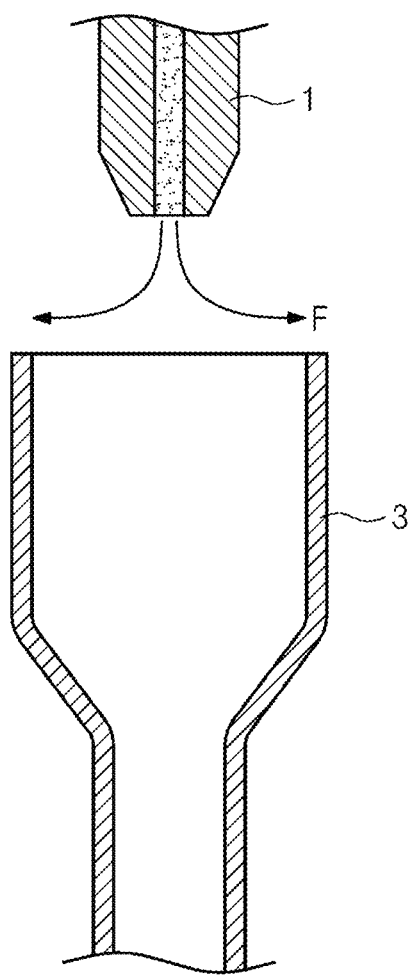
FIGS. 2 and 3 are views illustrating flow states of fumes generated from a processing liquid in the liquid processing apparatus of FIG. 1.
Figure 3:
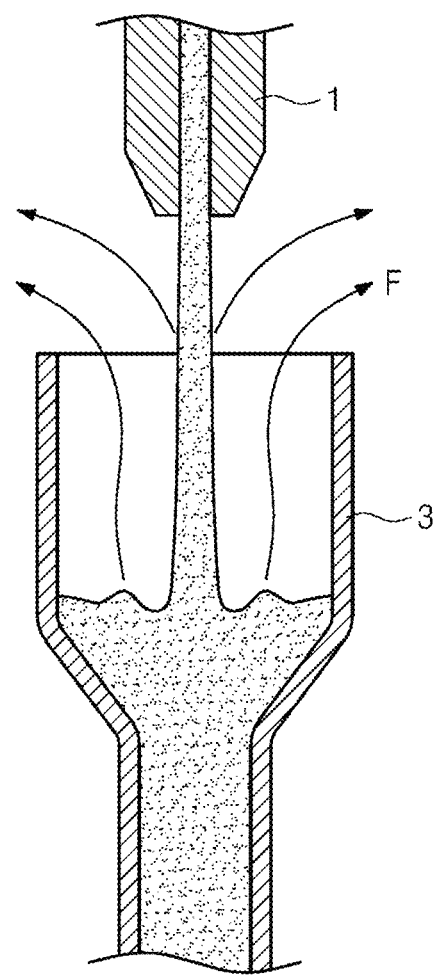

Hereinafter, embodiments of the inventive concept will be described in more detail with reference to the accompanying drawings. The inventive concept may, however, be embodied in different forms and should not be constructed as limited to the embodiments set forth herein.

These embodiments are provided so that this disclosure will be thorough and complete, and will fully convey the scope of the inventive concept to those skilled in the art. In the drawings, the dimensions of components are exaggerated for clarity of illustration.

Hereinafter, substrate processing equipment according to the inventive concept will be described. The substrate processing equipment may perform a liquid processing process of supplying a processing liquid onto a substrate and a cleaning process.

Figure 4:
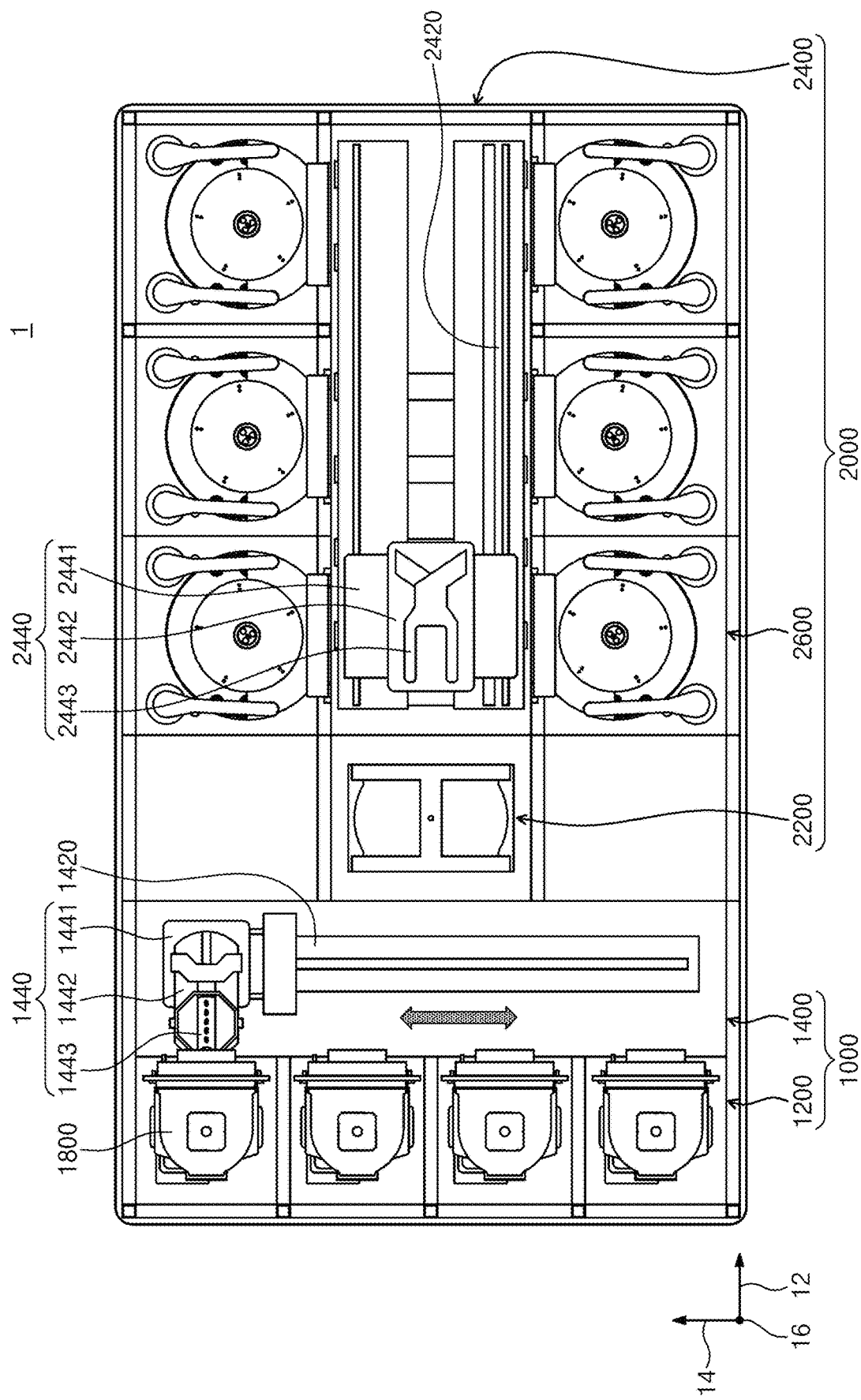
FIG. 4 is a schematic plan view illustrating substrate processing equipment according to an embodiment of the inventive concept.

FIG. 4 is a schematic plan view illustrating substrate processing equipment 1 according to an embodiment of the inventive concept. The substrate processing equipment 1 has an index module 1000 and a processing module 2000. The index module 1000 has load ports 1200 and a transfer frame 1400. The load ports 1200, the transfer frame 1400, and the processing module 2000 are sequentially arranged in a row.

Hereinafter, the direction in which the load ports 1200, the transfer frame 1400, and the processing module 2000 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

Carriers 1800 having substrates W received therein are placed on the load ports 1200. The load ports 1200 are arranged in a row along the second direction 14. FIG. 1 illustrates an example that the index module 1000 has four load ports 1200. However, the number of load ports 1200 may be increased or decreased depending on conditions such as process efficiency and footprint of the processing module 2000.

Each of the carriers 1800 has a plurality of slots (not illustrated) formed therein to support the edges of the substrates W. The plurality of slots are arranged in the third direction 16, and the substrates W are stacked one above another with a spacing gap therebetween in the carrier 1800 along the third direction 16. A front opening unified pod (FOUP) may be used as the carrier 1800.

The processing module 2000 has a buffer unit 2200, a transfer chamber 2400, and process chambers 2600. The transfer chamber 2400 is arranged such that the longitudinal direction thereof is parallel to the first direction 12. The process chambers 2600 are disposed on opposite sides of the transfer chamber 2400 in the second direction 14.

The process chambers 2600 located on one side of the transfer chamber 2400 and the process chambers 2600 located on an opposite side of the transfer chamber 2400 are symmetric with respect to the transfer chamber 2400. Some of the process chambers 2600 are arranged along the longitudinal direction of the transfer chamber 2400. The other process chambers 2600 are stacked one above another.

That is, the process chambers 2600 may be arranged in an A×B array (A and B being natural numbers of 1 or larger) on the opposite sides of the transfer chamber 2400. Here, A denotes the number of process chambers 2600 arranged in a row along the first direction 12, and B denotes the number of process chambers 2600 arranged in a column along the third direction 16.

In the case where four or six process chambers 2600 are disposed on the opposite sides of the transfer chamber 2400, the process chambers 2600 may be arranged in a 2×2 or 3×2 array. The number of process chambers 2600 may be increased or decreased. Alternatively, the process chambers 2600 may be disposed on only one side of the transfer chamber 2400. In another case, the process chambers 2600 may be disposed in a single layer on the opposite sides of the transfer chamber 2400.

The buffer unit 220 is disposed between the transfer frame 1400 and the transfer chamber 2400. The buffer unit 2200 provides a space in which substrates W stay before transferred between the transfer chamber 2400 and the transfer frame 1400. The buffer unit 2200 has a plurality of slots (not illustrated) therein, on which the substrates W are placed. The slots (not illustrated) are spaced apart from each other along the third direction 16. The buffer unit 2200 is open at one side facing the transfer frame 1400 and at an opposite side facing the transfer chamber 2400.

The transfer frame 1400 transfers the substrates W between the carriers 1800 placed on the load ports 1200 and the butter unit 2200. An index rail 1420 and an index robot 1440 are provided in the transfer frame 1400. The index rail 1420 is arranged such that the longitudinal direction thereof is parallel to the second direction 14.

The index robot 1440 is installed on the index rail 1420 and linearly moves along the index rail 1420 in the second direction 14. The index robot 1440 has a base 1441, a body 1442, and index arms 1443. The base 1441 is installed so as to be movable along the index rail 1420. The body 1442 is coupled to the base 1441. The body 1442 is provided on the base 1441 so as to be movable along the third direction 16.

Furthermore, the body 1442 is configured to rotate on the base 1441. The index arms 1443 are coupled to the body 1442 and configured to move forward and backward relative to the body 1442. The index arms 1443 are configured to operate separately.

The index arms 1443 are stacked one above another with a spacing gap therebetween in the third direction 16. Some of the index arms 1443 are used to transfer substrates W from the processing module 2000 to the carriers 1800, and the other index arms 1443 are used to transfer substrates W from the carriers 1800 to the processing module 2000. Accordingly, it is possible to prevent particles generated from substrates W to be processed from adhering to processed substrates W in the process in which the substrates W are transferred by the index robot 1440.

The transfer chamber 2400 transfers substrates W between the buffer unit 2200 and the process chambers 2600 and between the process chambers 2600. A guide rail 2420 and a main robot 2440 are provided in the transfer chamber 2400. The guide rail 2420 is arranged such that the longitudinal direction thereof is parallel to the first direction 12.

The main robot 2440 is installed on the guide rail 2420 and linearly moves on the guide rail 2420 along the first direction 12. The main robot 2440 has a base 2441, a body 2442, and main arms 2443. The base 2441 is installed so as to be movable along the guide rail 2420.

The body 2442 is coupled to the base 2441. The body 2442 is provided on the base 2441 so as to be movable along the third direction 16. Furthermore, the body 2442 is configured to rotate on the base 2441.

The main arms 2443 are coupled to the body 2442 and configured to move forward and backward relative to the body 2442. The main arms 2443 are configured to operate separately. The main arms 2443 are stacked one above another with a spacing gap therebetween in the third direction 16.

The main arms 2443 used to transfer substrates W from the buffer unit 2200 to the process chambers 2600 may differ from the main arm 2443 used to transfer substrates W from the process chambers 2600 to the buffer unit 2200.

Each of the process chambers 2600 includes a substrate processing apparatus 10 for performing liquid processing on a substrate W. The substrate processing apparatuses 10 provided in the respective process chambers 2600 may have different structures according to the types of liquid processing processes performed therein.

Alternatively, the substrate processing apparatuses 10 in the respective process chambers 2600 may have the same structure. In another case, the process chambers 2600 may be divided into a plurality of groups. The substrate processing apparatuses 10 provided in the process chambers 2600 belonging to the same group may have the same structure. The substrate processing apparatuses 10 provided in the process chambers 2600 belonging to different groups may have different structures.

For example, in the case where the process chambers 2600 are divided into two groups, a first group of process chambers 2600 may be disposed on the one side of the transfer chamber 2400, and a second group of process chambers 2600 may be disposed on the opposite side of the transfer chamber 2400.

Alternatively, on the opposite sides of the transfer chamber 2400, the first group of process chambers 2600 may be disposed in a lower layer, and the second group of process chambers 2600 may be disposed in an upper layer. The first group of process chambers 2600 may be distinguished from the second group of process chambers 2600 according to the types of chemicals used and the types of cleaning methods.

Figure 5:
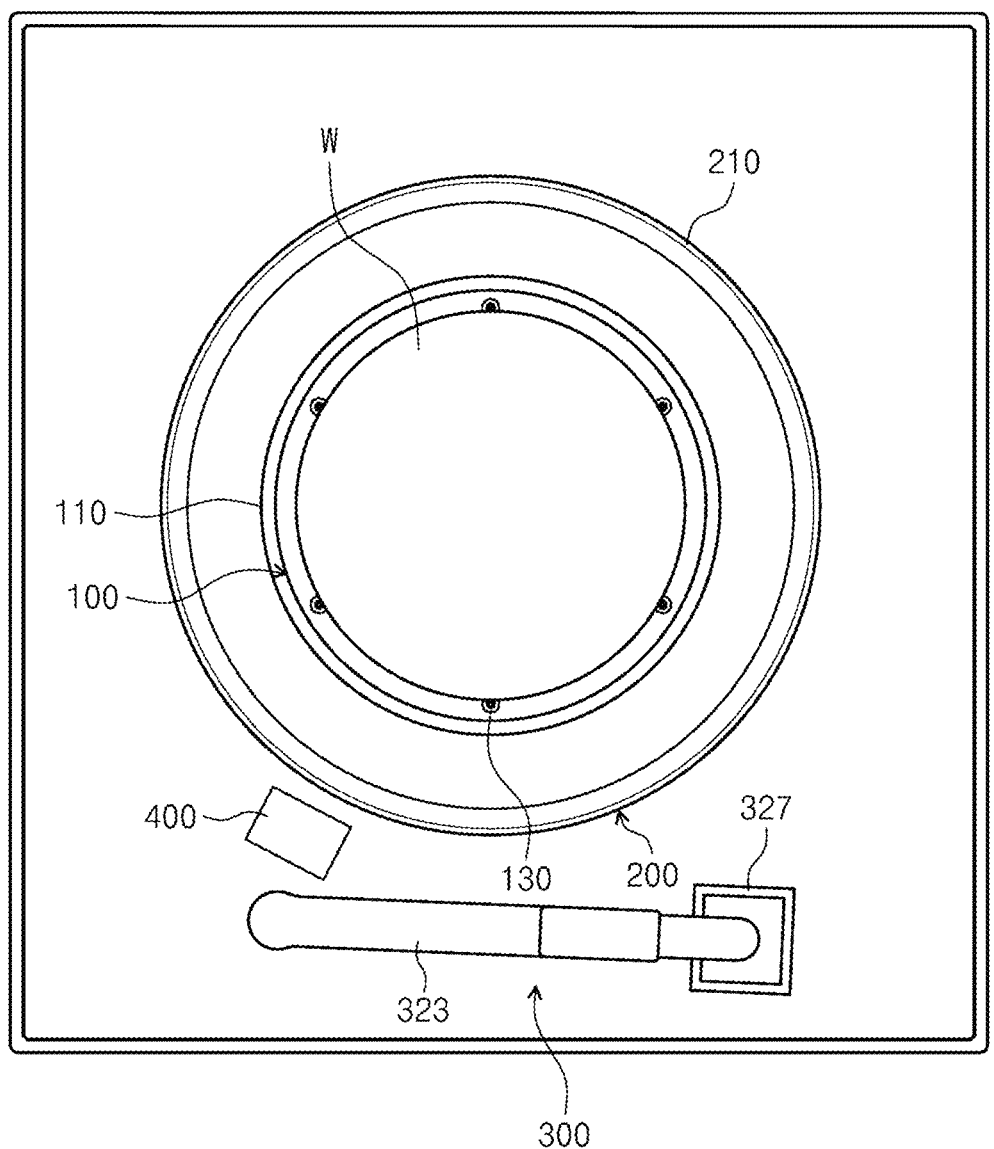
FIG. 5 is a schematic plan view illustrating a liquid processing chamber of FIG. 4 according to an embodiment of the inventive concept.
Figure 6:
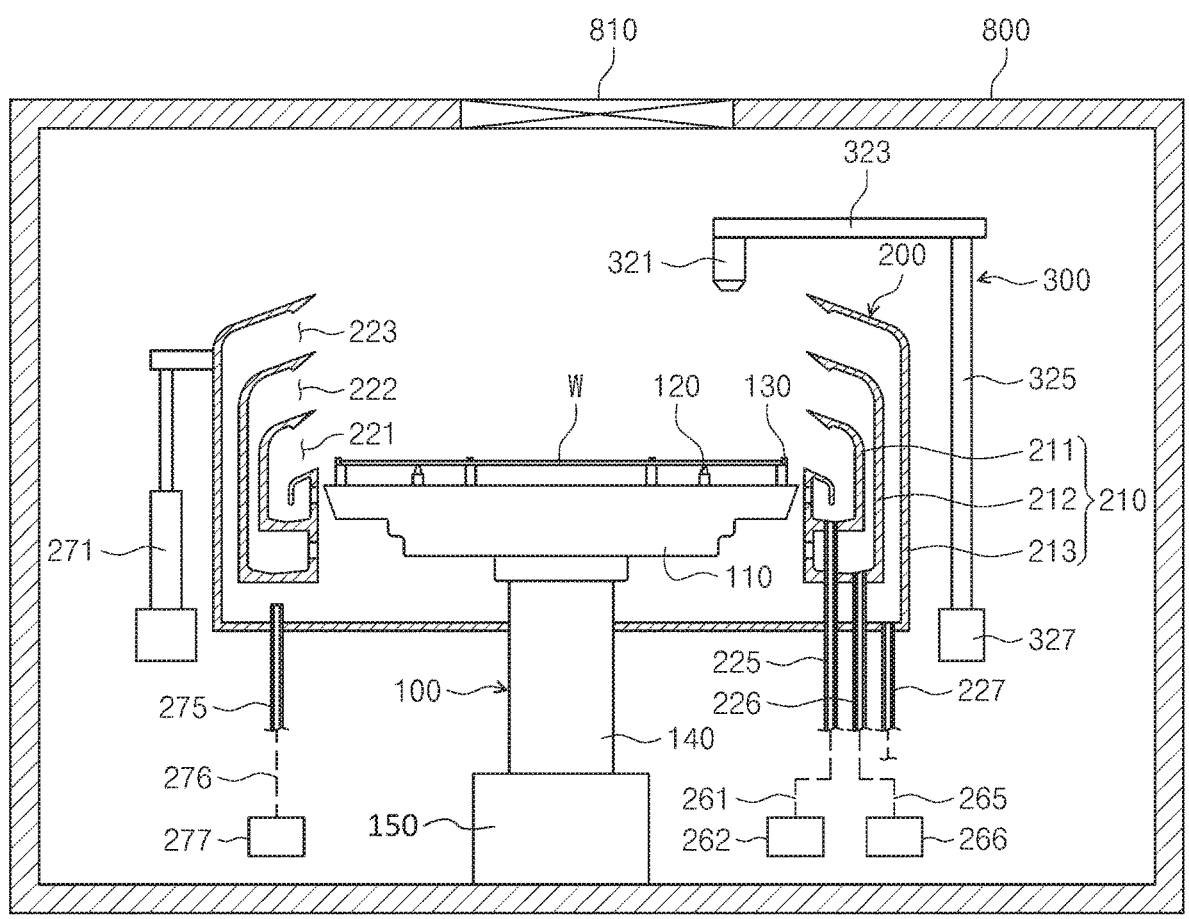
FIG. 6 is a schematic sectional view illustrating the liquid processing chamber of FIG. 4.

FIGS. 5 and 6 are schematic views illustrating a liquid processing chamber of FIG. 4 according to an embodiment of the inventive concept. The substrate processing apparatus 10 includes a support unit 100, a container 200, a processing liquid supply unit 300, a standby port 400, and a chamber 800.

The chamber 800 has a rectangular parallelepiped shape. The chamber 800 has a processing space inside. The container 200, the processing liquid supply unit 300, and the standby port 400 are disposed in the space inside the chamber 800.

A fan filter unit 810 is installed at the top of the chamber 800. The fan filter unit 810 generates a descending air flow in the chamber 800. The fan filter unit 810 includes a filter and an air supply fan. The filter and the air supply fan may be modularized as a single unit. The fan filter unit 810 filters outdoor air and supplies the filter air into the chamber 800. The outdoor air passes through the fan filter unit 810 and is supplied into the chamber 800 to form a descending air flow.

The support unit 100 supports a substrate W to be processed and the container 200 collects a processing liquid scattered by rotation of the substrate W. The processing liquid supply unit 300 supplies the processing liquid onto the substrate W. The standby port 400 provides a place where a nozzle 321 is temporarily stored in a standby position before the processing liquid supply unit 300 supplies the processing liquid to the top side of the substrate W. Hereinafter, the components of the substrate processing apparatus 10 will be described in detail.

The support unit 100 supports the substrate W. The support unit 100 includes a chuck 110, support pins 120, chucking pins 130, a support shaft 140, and a support shaft actuator 150.

The chuck 110 has a circular plate shape with a predetermined thickness. The chuck 110 has a larger diameter than the substrate W. The top side of the chuck 110 has a larger diameter than the bottom side of the chuck 110, and the lateral side of the chuck 110 is inclined to have a gradually decreasing diameter from the top side to the bottom side of the chuck 110.

The support pins 120 and the chucking pins 130 are provided on the top side of the chuck 110. The support pins 120 protrude upward from the top side of the chuck 110, and the substrate W is placed on upper ends of the support pins 120. The support pins 120 are spaced apart from each other on the top side of the chuck 110. At least three support pins 120 are provided to support different regions of the substrate W.

The chucking pins 130 protrude upward from the top side of the chuck 110 and support the lateral side of the substrate W. The chucking pins 130 are arranged in a ring shape along the edge region of the chuck 110. The chucking pins 130 prevent the substrate W from being moved in the lateral direction of the chuck 110 by a centrifugal force when the chuck 110 rotates.

The chucking pins 130 may linearly move along the radial direction of the chuck 110. The chucking pins 130 linearly move away from the center of the chuck 110 when the substrate W is loaded or unloaded. The chucking pins 130 linearly move toward the center of the chuck 110 to support the lateral side of the substrate W when chucking the substrate W.

The support shaft 140 is located below the chuck 100 to support the chuck 110. The support shaft 140 is a hollow shaft and transmits a rotational force to the chuck 110. The support shaft actuator 150 is provided at a lower end of the support shaft 140. The support shaft actuator 150 generates a rotational force to rotate the support shaft 140 and the chuck 110. The support shaft actuator 150 may adjust the rotational speed of the chuck 110.

The container 200 collects the processing liquid supplied onto the substrate W. The container 200 includes a collection bowl 210, a collection line 261, a waste liquid line 265, a lifting unit 271, and an exhaust tube 275.

The collection bowl 210 prevents the processing liquid scattered by rotation of the substrate W from splattering outside the collection bowl 210 and prevents fumes generated during processing from flowing out of the collection bowl 210. The collection bowl 210 is open at the top thereof and has a space formed therein, in which the chuck 110 is located.

The collection bowl 210 has collection bowls 211, 212, and 213 for separately collecting processing liquids supplied onto the substrate W according to process steps. According to an embodiment, the three collection bowls 211, 212, and 213 are provided. The collection bowl 210 includes the first collection bowl 211, the second collection bowl 212, and the third collection bowl 213.

The first to third collection bowls 211, 212, and 213 have an annular vessel shape. The first collection bowl 211 surrounds the chuck 110, the second collection bowl 212 surrounds the first collection bowl 211, and the third collection bowl 213 surrounds the second collection bowl 212.

Inlets 221, 222, and 223 are formed in the collection bowl 210 by the arrangement of the first to third collection bowls 211, 212, and 213. The inlets 221, 222, and 223 have a ring shape and are provided along the periphery of the chuck 110. The first collection bowl 211 forms the first inlet 221. The second collection bowl 212 forms the second inlet 222 above the first inlet 221. The third collection bowl 213 forms the third inlet 223 above the second inlet 222. The processing liquids scattered by rotation of the substrate W flow into the inlets 221, 222, and 223 and are collected by the collection bowls 211, 212, and 213.

Discharge tubes 225, 226, and 227 are connected to the bottom walls of the collection bowls 211, 212, and 213. Ends of the discharge tubes 225, 226, and 227 are located at the same heights as the bottom walls of the collection bowls 211, 212, and 213, and the discharge tubes 225, 226, and 227 serve as passages through which the processing liquids collected by the collection bowls 211, 212, and 213 are discharged to the outside. The first to third discharge tubes 225, 226, and 227 are connected to the first to third collection bowls 211, 212, and 213, respectively.

The exhaust tube 275 is additionally connected to the bottom wall of the third collection bowl 213. An end of the exhaust tube 275 is located in a higher position than the bottom wall of the third collection bowl 213. The exhaust tube 275 serves as a passage through which fumes generated in the collection bowl 210 are exhausted to the outside. The exhaust tube 275 is connected to a pump 277 through an exhaust line 276. The pump 277 applies vacuum pressure to the exhaust tube 275. The vacuum pressure applied by the pump 277 may vary depending on process steps. Due to this, suction pressure by which the exhaust tube 275 suctions the fumes varies.

The collection line 261 connects the first discharge tube 225 and a collection tank 262. A processing liquid flowing into the first discharge tube 225 passes through the collection line 261 and is stored in the collection tank 262. The processing liquid stored in the collection tank 262 is used again in a process through a regeneration process.

The waste liquid line 265 connects the second discharge tube 226 and a waste liquid tank 266. A processing liquid flowing into the second discharge tube 226 passes through the waste liquid line 265 and is stored in the waste liquid tank 266. The processing liquid stored in the waste liquid tank 266 is discarded without reuse.

The lifting unit 271 vertically moves the collection bowl 210 to adjust the height of the collection bowl 210 relative to the chuck 110. The lifting unit 271 lowers the collection bowl 210 such that the chuck 110 further protrudes upward beyond the collection bowl 210 when the substrate W is loaded onto or unloaded from the chuck 110. Furthermore, the lifting unit 271 raises the collection bowl 210 such that the processing liquids separately flow into the inlets 221, 222, and 223 according to process steps during processing. The lifting unit 271 raises the collection bowl 210 such that the substrate W is located at a height corresponding to one of the inlets 221, 222, and 223.

The processing liquid supply unit 300 supplies the processing liquid onto the substrate W. The processing liquid supply unit 300 includes the nozzle 321, a nozzle arm 323, a nozzle support rod 325, and a nozzle actuator 327.

The nozzle 321 supplies the processing liquid to the top side of the substrate W. The nozzle arm 323 extends in one direction, and the nozzle 321 is mounted on the tip end of the nozzle arm 323. The nozzle arm 323 supports the nozzle 321. The nozzle support rod 325 is mounted on the rear end of the nozzle arm 323. The nozzle support rod 325 is located below the nozzle arm 323 and is disposed perpendicular to the nozzle arm 323.

The nozzle actuator 327 is provided at a lower end of the nozzle support rod 325. The nozzle actuator 327 rotates the nozzle support rod 325 about the longitudinal axis of the nozzle support rod 325. The nozzle arm 323 and the nozzle 321 swing about the nozzle support rod 325 by the rotation of the nozzle support rod 325. The nozzle 321 may swing between the outside and the inside of the collection bowl 210.

The standby port 400 provides a space where the nozzle 321 stands by in a standby position before supplying the processing liquid. The nozzle 321 discharges the processing liquid into the standby port 400.

Figure 7:
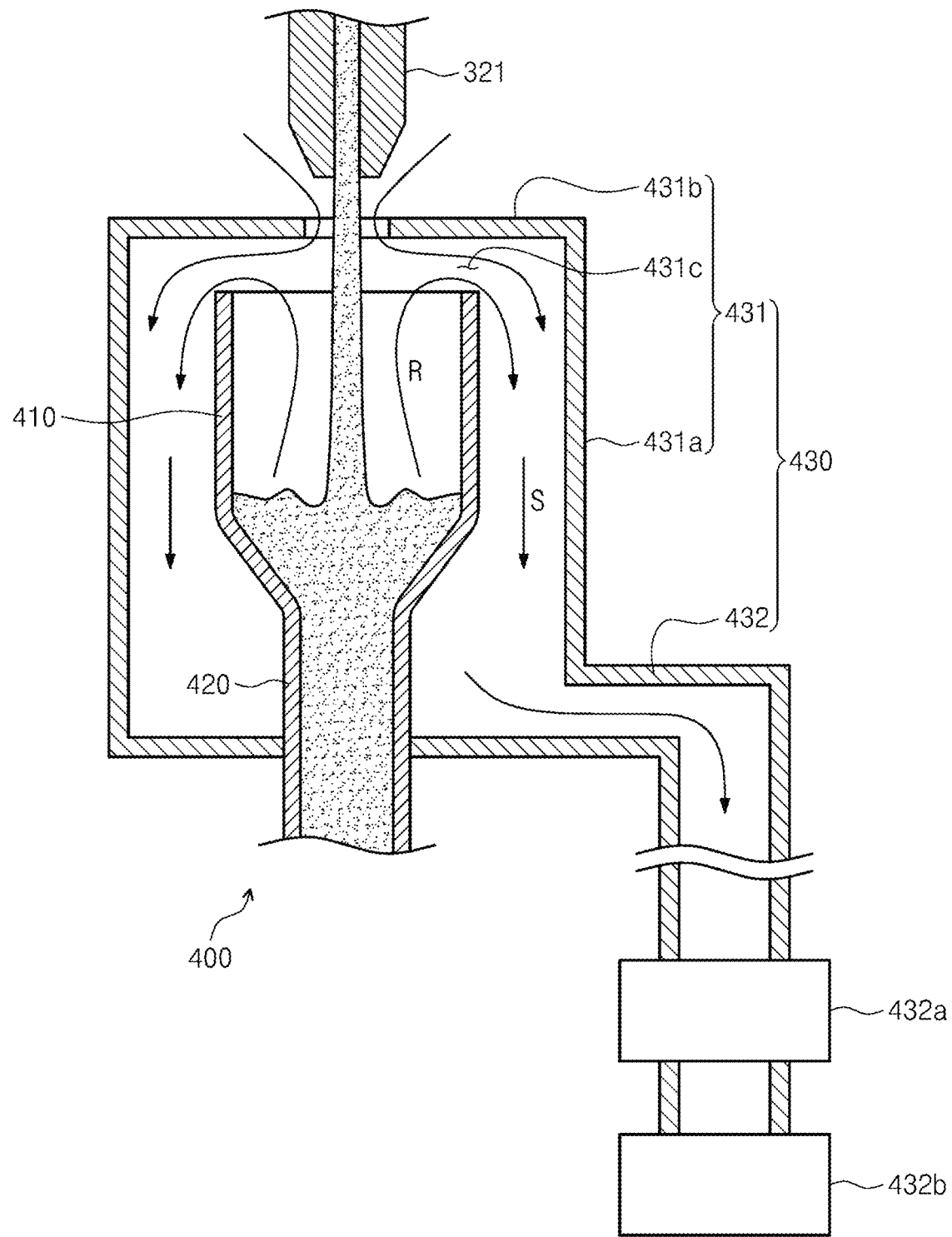
FIG. 7 is a schematic sectional view illustrating a standby port of FIG. 5.

FIG. 7 is a schematic view illustrating the standby port of FIG. 5. The standby port 400 includes a body 410, a drain line 420, and an exhaust unit 430.

The body 410 provides an inner space R into which a processing liquid discharged from the nozzle 321 is introduced. The body 410 has a cylindrical shape, and a lower portion of the body 410 has a smaller diameter than an upper portion of the body 410. The lower portion of the body 410 is connected with the drain line 420.

The drain line 420 serves to drain the processing liquid discharged from the nozzle 321. The drain line 420 is connected to the lower portion of the body 410. The discharged processing liquid passing through the drain line 420 is stored in a separate reservoir (not illustrated). The drain line 420 extends in the longitudinal direction thereof. The drain line 420 has a smaller diameter than the body 410.

The exhaust unit 430 suctions and exhausts an atmosphere in the inner space R and fumes generated from an outlet end of the nozzle 321. The exhaust unit 430 surrounds the body 410 and has a cylindrical shape with an exhaust space S inside. The exhaust unit 430 includes a housing 431 and an exhaust line 432. The housing 431 is provided at the upper portion of the body 410, and the exhaust line 432 is connected to a lower portion of the housing 431.

The housing 431 includes a sidewall 431a, an upper wall 431b, and an inlet 431c. The sidewall 431a has a tubular shape concentric with the body 410. The sidewall 431a has a larger diameter than the body 410. The upper wall 431b extends inward from an upper end of the sidewall 431a. The upper wall 431b is located above the body 410. The area of a central hole C formed in the center of the upper wall 431b is smaller than the area of the inner space R when viewed from above.

The inlet 431c is a spacing space between the upper end of the body 410 and a lower end of the upper wall 431b. The inlet 431c is a passage through which the atmosphere in the inner space R and the fumes generated from the outlet end of the nozzle 321 flow into the exhaust space S.

When the processing liquid is discharged from the nozzle 321 into the inner space R, the nozzle 321 is located above the upper wall 431b. The distance between the outlet end of the nozzle 321 and the upper wall 431b is less than three times the vertical width of the inlet 431c.

The exhaust line 432 suctions an atmosphere in the exhaust space S to apply a suction force to the inlet 431c. The exhaust line 432 includes a vacuum pump 432a and a fume processing vessel 432b. The vacuum pump 432a is located outside the chamber 800 and generates negative pressure in the exhaust line 432 to allow the atmosphere in the exhaust space S to flow into the exhaust line 432. The fume processing vessel 432b is located on a side of the vacuum pump 432a. The atmosphere in the inner space R and the fumes generated from the outlet end of the nozzle 321, which are suctioned through the exhaust line 432, are stored in the fume processing vessel 432b.

According to the above-configured standby port 400, when the nozzle 321 discharges the processing liquid into the standby port 400, the exhaust unit 430 suctions the fumes generated from the outlet end of the nozzle 321 and the inside of the standby port 400, thereby preventing the fumes of the discharged processing liquid from being diffused into the chamber 800.

Figure 8:
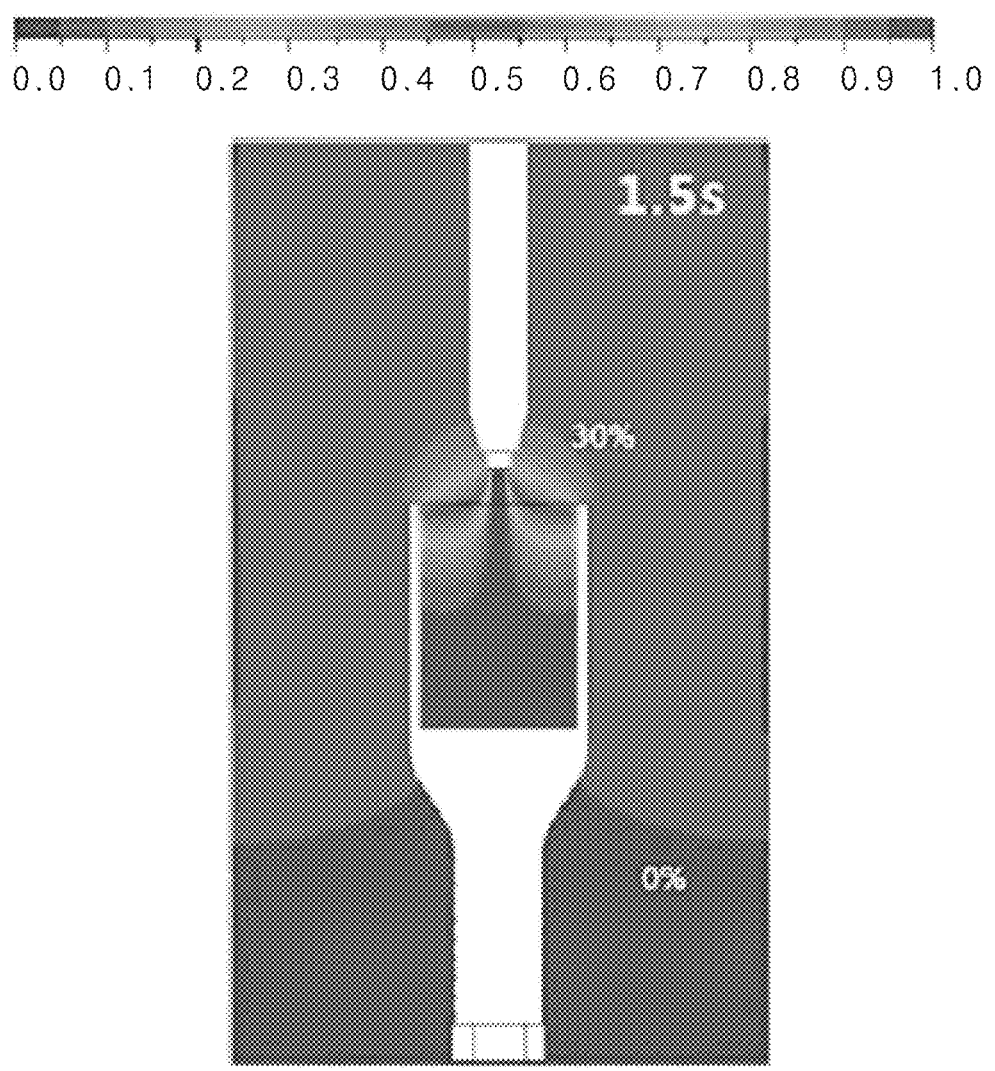
FIGS. 8 and 9 illustrate processing liquid concentration distribution inside and outside general standby ports when processing liquids are discharged from nozzles into the standby ports.
Figure 9:
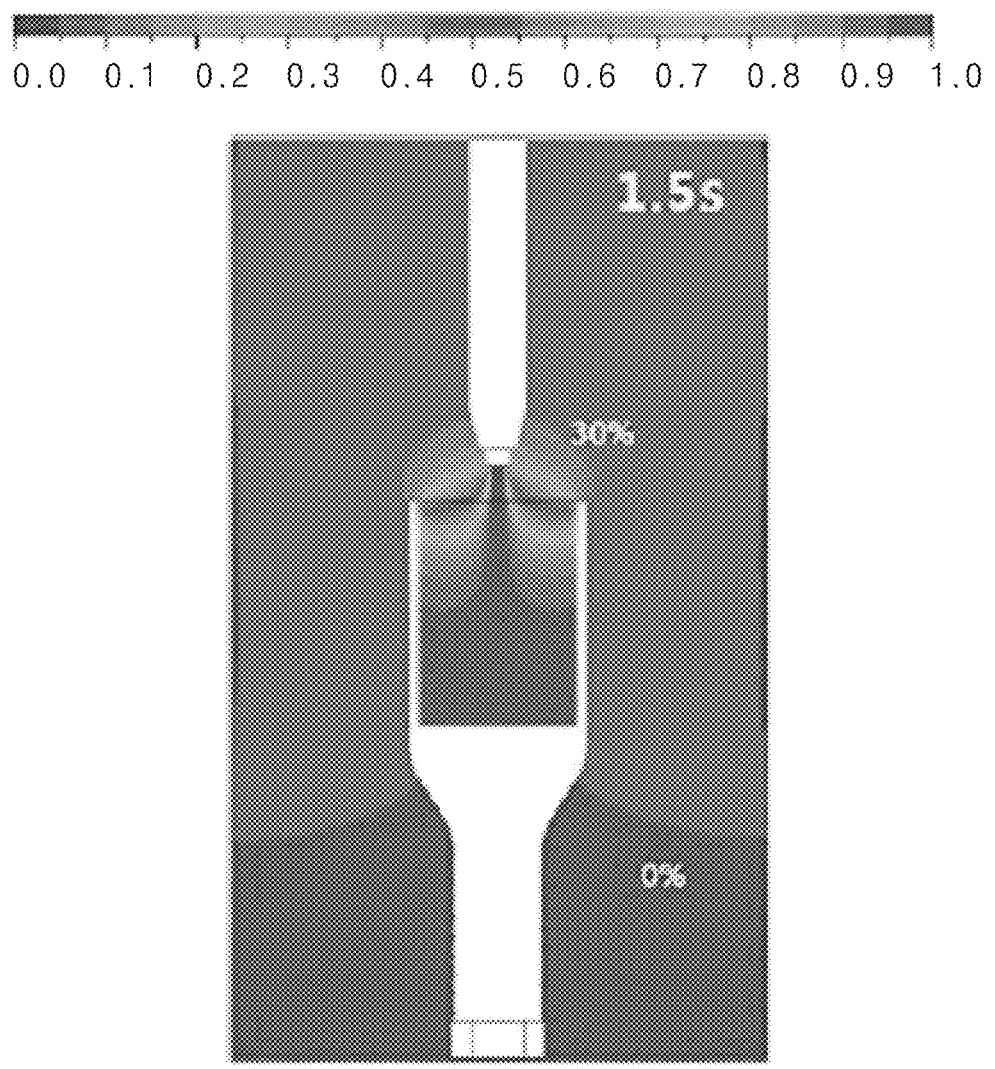
Figure 10:
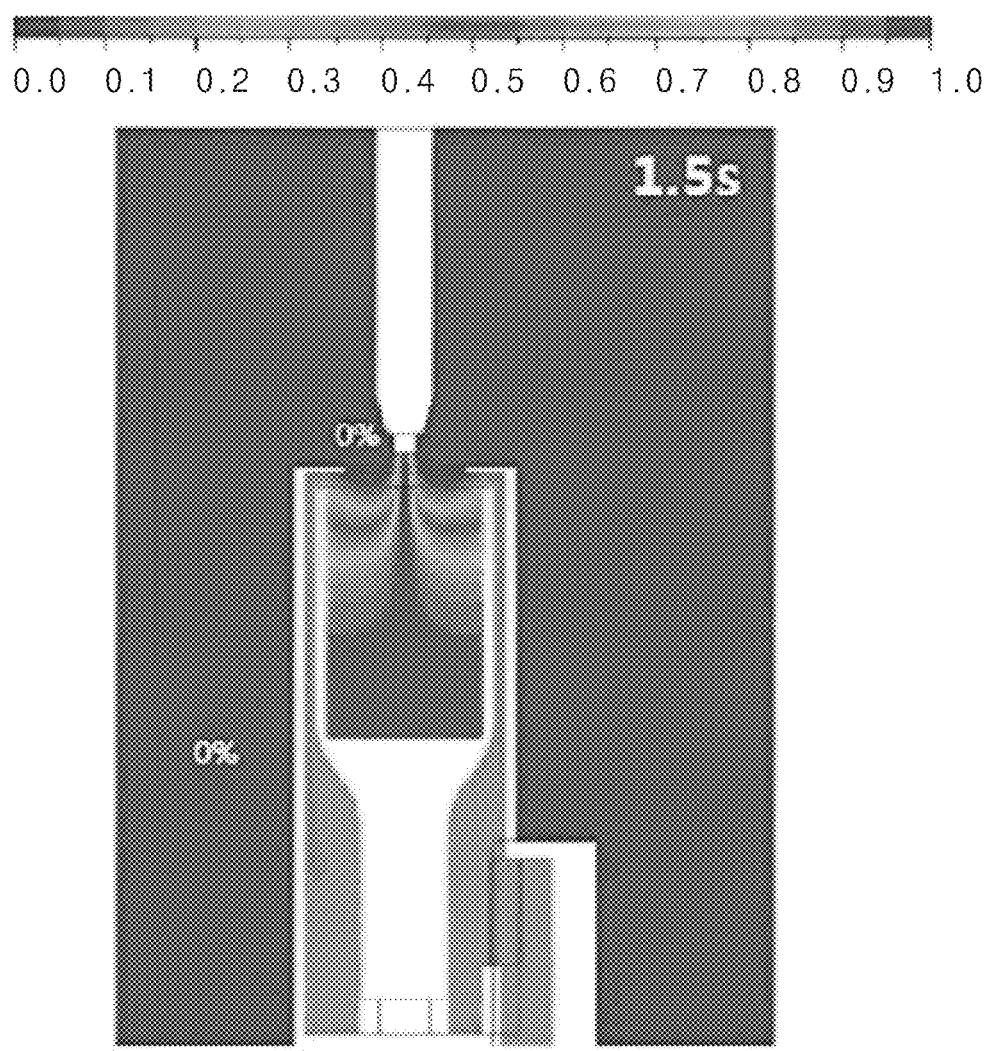
FIG. 10 illustrates processing liquid concentration distribution inside and outside the standby port of FIG. 5 when a processing liquid is discharged from a nozzle into the standby port.

FIGS. 8 to 10 illustrate simulation results of processing liquid concentration distribution inside and outside general standby ports and the standby port of FIG. 5, with processing liquids discharged into the general standby ports and the standby port of FIG. 5 for 1.5 seconds.

Ammonia was used as the processing liquids, and modeling values of apparatuses generally applied to a liquid processing chamber were applied for physical properties of the standby ports, nozzles, and chambers.

Bars illustrated in FIGS. 8 to 10 represent the concentration of ammonia included in the processing liquids. FIG. 8 illustrates a simulation result of ammonia concentration distribution inside and outside a general standby port that is open at the top, when a processing liquid is discharged from a nozzle into the general standby port.

When the standby port of FIG. 8 is used, the concentration of ammonia outside the standby port is about 20%, and the concentration of ammonia near the nozzle is about 30%. From this, it can be seen that fumes of the processing liquid generated in the standby port are discharged to the outside of the standby port.

FIG. 9 illustrates a simulation result of processing liquid concentration distribution inside and outside a standby port with an intake apparatus connected to an inner space of the standby port to take in an atmosphere in the standby port, when a processing liquid is discharged from a nozzle into the standby port.

When the standby port of FIG. 9 is used, the concentration of ammonia outside the standby port is nearly 0%. That is, ammonia is not detected. However, the concentration of ammonia detected on the opposite side to the intake apparatus is about 30% although ammonia is rarely detected in the region adjacent to the intake apparatus around the nozzle. From this, it can be seen that fumes are not exhausted well in the nozzle region on the opposite side to the intake apparatus.

FIG. 10 illustrates a simulation result of processing liquid concentration distribution inside and outside the standby port 400 of FIG. 5, when a processing liquid is discharged from the nozzle 321 into the standby port 400. Referring to FIG. 10, it can be seen that ammonia is rarely detected in the entire region outside the standby port 400 and the entire region around the nozzle 321.

Referring to FIGS. 8 to 10, it can be seen that in the structure of FIG. 8, the concentration of ammonia in the entire region outside the standby port is high and in the structure of FIG. 9, the concentration of ammonia in a partial area around the nozzle is high, whereas in the structure of FIG. 10, ammonia is rarely detected in the entire region outside the standby port and the entire region around the nozzle, and the exhaust efficiency of the standby port is excellent.

Figure 11:
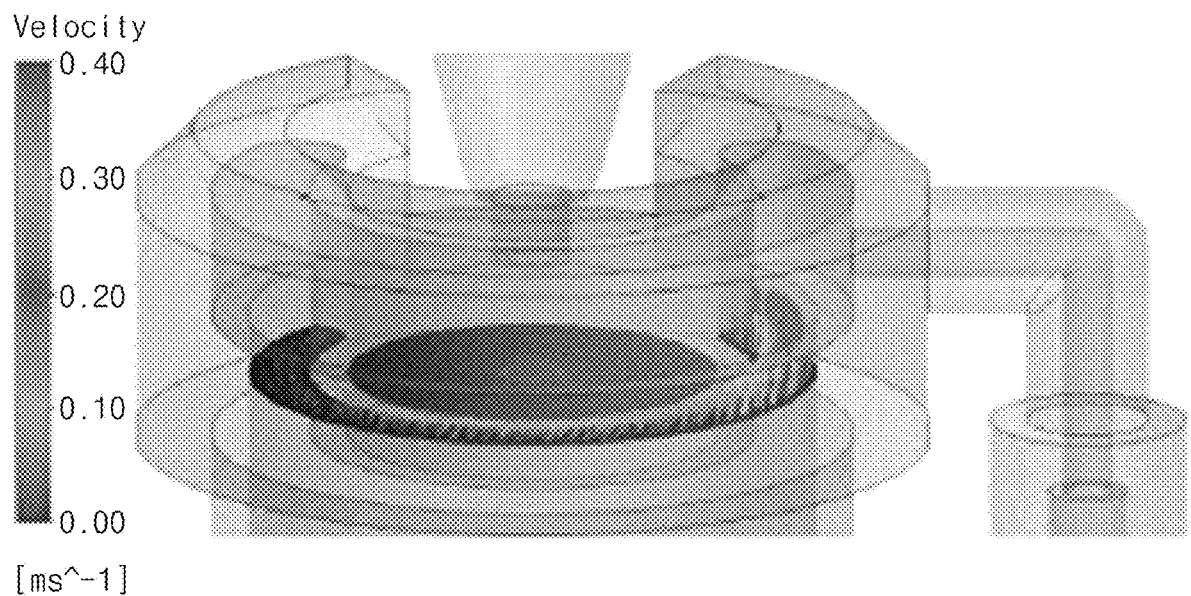
FIG. 11 illustrates the speed of a suction fluid generated in a general standby port.
Figure 12:
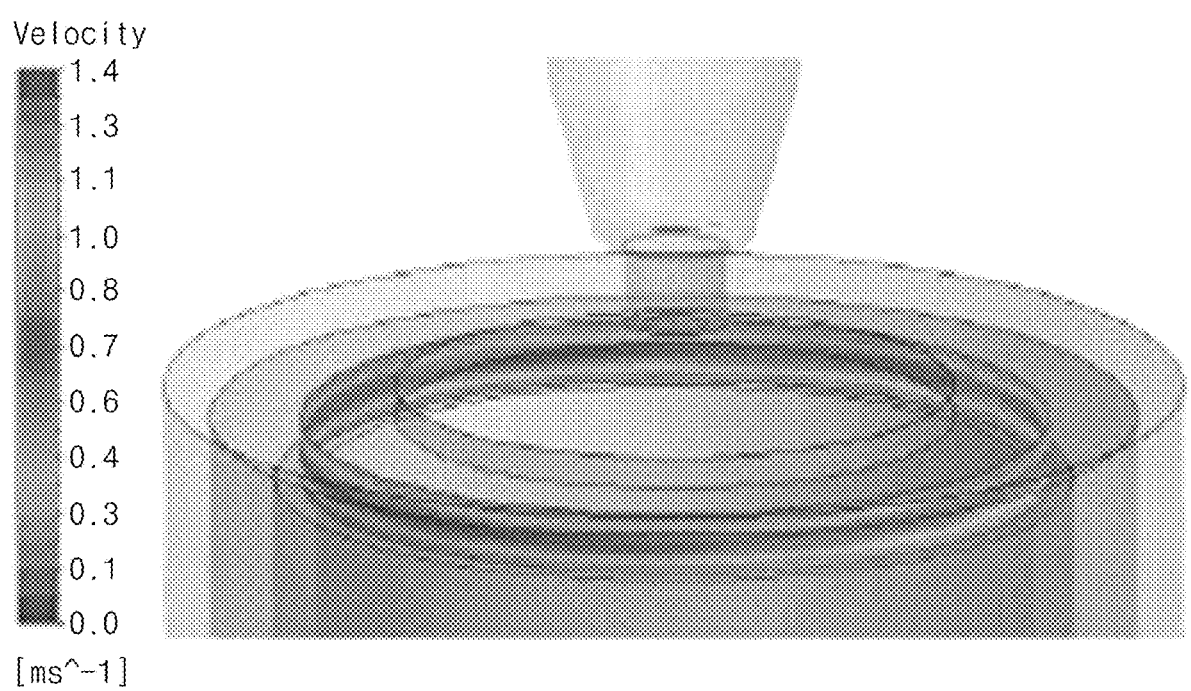
FIG. 12 illustrates the speed of a suction fluid generated in the standby port of FIG. 5.

FIG. 11 illustrates a simulation result of the speed of a suction fluid generated in the standby port of FIG. 9, and FIG. 12 illustrates a simulation result of the speed of a suction fluid generated in the standby port of FIG. 5. Color legends of a bar type in FIGS. 11 and 12 represent the flow speed of fumes.

Referring to FIG. 11, the flow speed of fumes is higher in the region of the standby port that faces the intake apparatus than in the other regions of the standby port. From this, it can be seen that when the standby port of FIG. 9 is used, the exhaust of fumes is not uniform according to regions in the standby port.

In contrast, it can be seen that when the standby port of FIG. 5 is used, the exhaust of fumes is performed well in the entire region inside the standby port and the flow speed is substantially uniform (see FIG. 12).

While the standby port and the substrate processing apparatus having the same have been described above in detail, the inventive concept is not limited thereto and is applicable to all facilities that perform liquid processing on substrates.

The above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art.

While it has been described that the area of the central hole C formed in the center of the upper wall 431b is smaller than the area of the inner space R when viewed from above, the area of the central hole C formed in the center of the upper wall 431b may be greater than or equal to the area of the inner space R.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
a support unit configured to support the substrate;

a container configured to surround the support unit and collect a processing liquid;

a processing liquid supply unit including a nozzle configured to supply the processing liquid onto the substrate supported by the support unit; and a standby port where the nozzle stands by when the substrate is not processed, the standby port being disposed on a side of the container, wherein the standby port includes:

a body including an inner space that is open at the top such that the processing liquid discharged from the nozzle is introduced into the inner space;

a drain line connected to the body and configured to drain the processing liquid in the inner space; and an exhaust unit configured to exhaust an atmosphere in the inner space, and wherein the exhaust unit includes:

a housing having a ring shape, the housing being configured to surround the body and having an exhaust space into which the atmosphere in the inner space flows; and an exhaust line connected to the housing and configured to forcibly exhaust an atmosphere in the housing, wherein an inlet of the exhaust space, into which the atmosphere in the inner space flows, is provided above the inner space.

2. The apparatus of claim 1, wherein the exhaust line is connected to a lower end region of the housing.

3. The apparatus of claim 1, wherein the housing includes:

a sidewall configured to surround the body; and an upper wall extending inward from an upper end of the sidewall and located above the body, wherein a spacing space between an upper end of the body and a lower end of the upper wall serves as an inlet through which the atmosphere in the inner space flows into the exhaust space.

4. The apparatus of claim 3, wherein an area of a central hole formed in the center of the upper wall is smaller than an area of the inner space when viewed from above.

5. The apparatus of claim 3, wherein the nozzle is disposed above the upper wall when the processing liquid is discharged from the nozzle into the inner space, and a distance between an outlet end of the nozzle and the upper wall is less than three times a vertical width of the inlet.

6. A standby port provided in a chamber configured to perform liquid processing on a substrate, the standby port comprising:

a body including an inner space that is open at the top such that a processing liquid discharged from a nozzle is introduced into the inner space;

a drain line connected to the body and configured to drain the processing liquid in the inner space; and an exhaust unit configured to exhaust an atmosphere in the inner space, wherein the exhaust unit includes:

a housing having a ring shape, the housing being configured to surround the body and having an exhaust space into which the atmosphere in the inner space flows; and an exhaust line connected to the housing and configured to forcibly exhaust an atmosphere in the housing, wherein an inlet of the exhaust space, into which the atmosphere in the inner space flows, is provided above the inner space.

7. The standby port of claim 6, wherein the exhaust line is connected to a lower end region of the housing.

8. The standby port of claim 6, wherein the housing includes:

a sidewall configured to surround the body; and an upper wall extending inward from an upper end of the sidewall and located above the body, wherein a spacing space between an upper end of the body and a lower end of the upper wall serves as an inlet through which the atmosphere in the inner space flows into the exhaust space.

* * * * *